United States Patent [19]

Kanitz et al.

[11] 3,990,048

[45] Nov. 2, 1976

[54] CARRIER DETECT CIRCUIT

[75] Inventors: Bruce R. Kanitz, Fairport, N.Y.;
Charles L. Jacobson, Plano, Tex.

[73] Assignee: Xerox Corporation, Stamford, Conn.

[22] Filed: May 27, 1975

[21] Appl. No.: 581,056

Related U.S. Application Data

[62] Division of Ser. No. 418,530, Nov. 23, 1973, Pat. No. 3,909,516.

[52] U.S. Cl. .................. 340/171 R; 307/235 N; 340/147 PC; 340/172
[51] Int. Cl.² .................................. H04Q 9/16
[58] Field of Search ............ 340/167 R, 171 R, 172, 340/147 PC, 167; 178/6.6 R; 330/22, 30 D, 31, 40, 96, 100, 146; 329/106, 136, 140, 179, 193; 328/111, 149; 325/466, 55; 307/231, 233, 235 N, 236

[56] References Cited
UNITED STATES PATENTS

| | | |
|---|---|---|
| 3,573,638 | 4/1971 | Cox, Jr. ...................... 307/235 N X |
| 3,651,470 | 3/1972 | Healey et al. ...................... 340/172 |
| 3,715,579 | 2/1973 | Eblovi .......................... 340/171 R X |
| 3,755,750 | 8/1973 | Heberling ................... 307/235 N X |
| 3,860,913 | 1/1975 | Weeks, Jr. et al. ......... 340/171 R X |

*Primary Examiner*—Donald J. Yusko

[57] ABSTRACT

A detector circuit utilizing two comparators, the first of which initially switches output at a first bias level, and the second of which switches output responsive to a preselected voltage on a capacitor. The voltage on the capacitor is controlled by the output of the first comparator which charges and discharges it through a dual time constant arrangement in order to sensitize the detector to activate a recorder after a preselected delay only upon receipt of a particularly shaped long duty cycle input signal. After receipt of the input signal, the bias level of the first comparator is changed so as to prevent switching until receipt of a second preselected input signal. In addition, after receipt of the first input signal, the time constant of charge-discharge arrangement for the capacitor is again altered.

2 Claims, 6 Drawing Figures

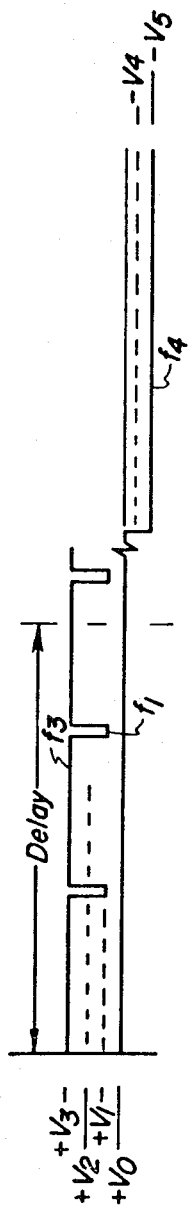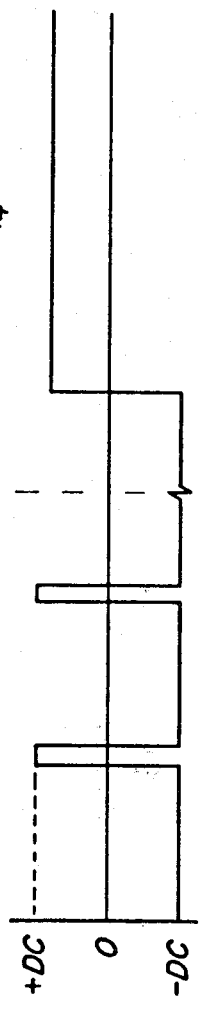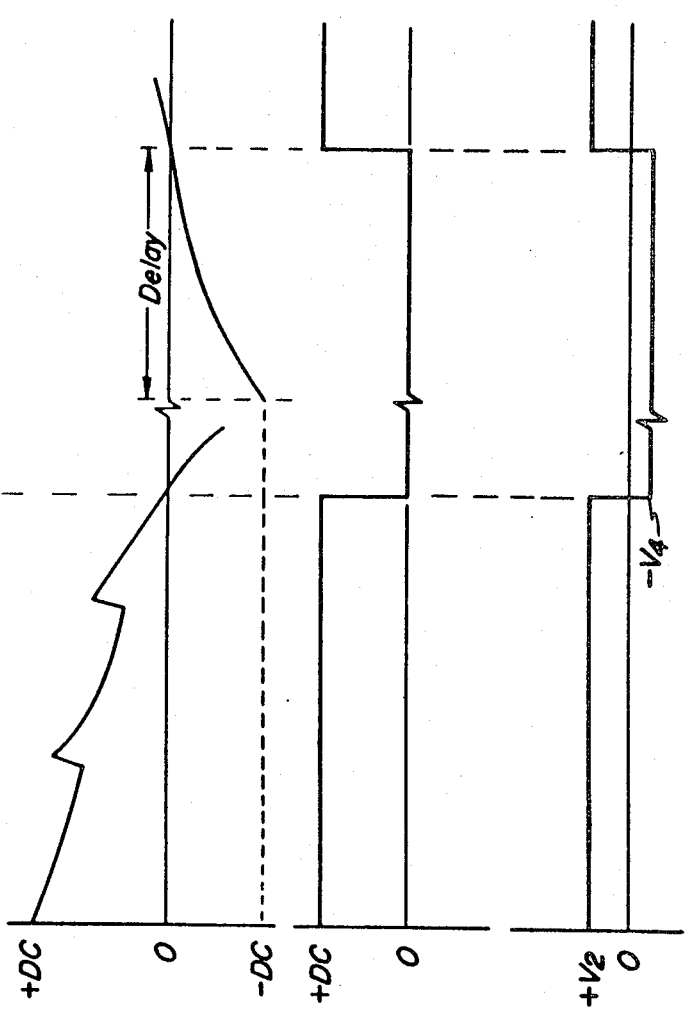

CARRIER DETECT CIRCUIT

This is a division of application Ser. No. 418,530, filed Nov. 23, 1973, now U.S. Pat. No. 3,909,516.

BACKGROUND OF THE INVENTION

The present invention relates to a carrier detector utilized in facsimile transceivers for transmitting the contents of a document to remote locations using standard telephone transmission facilities.

The functions of a facsimile transceiver system is to scan documents at a transmit station and to develop an information signal representative of the contents of the document, the information signal varying in a voltage range between a first potential corresponding to a white document area and a second potential corresponding to a dark document area. This information signal is then modulated into a form suitable for transmission over standard telephone transmission lines. The preferred form of modulation for such baseband signals is to frequency modulate them on a carrier signal into the audio range between arbitrary frequencies $f1$ and $f2$ transmittable by ordinary telephone circuitry, generally in the range of 1500 Hz to 2500 Hz.

The frequency modulated facsimile signal is then coupled into standard telephone transmission lines and taken therefrom again at the receiving station to the same standard handsets that are used for regular voice transmission, so that no special jacks or other electrical hookups are required. At the receiving station the above-mentioned frequency modulated facsimile signal is demodulated to recover the information signal which then operates a recorder or printing device. The printing device then reproduces the contents of the document originally scanned at the transmit station.

In prior art facsimile systems, in order to start up the recorder at the receiver unit prior to the actual transmission containing signals, a start control signal is transmitted by the transmit unit consisting of a relatively long burst of one frequency $f3$ (which may correspond to a dark document area) followed by a short burst of another frequency $f1$ (which may correspond to a white document area). This control signal is repeated for a preselected time period. At the receiver the above-noted start control signal is demodulated into a varying d.c. voltage signal similar to that illustrated in the left-hand portion of FIG. 2A, which signal is applied to a detector circuit of the invention in order to turn on the recorder. The detector therefore is designed to be particularly sensitive to a wave-shape of the type shown in FIG. 2A and correspondingly insensitive to noise or random signals at its input.

The print device or recorder at the receive station is likewise disabled or shut down after the completion of a transmitted document by a stop control signal generated at the transmit unit after the original document has been scanned. In the prior art machines, this stop control signal usually consists of a relatively long period of a continuous frequency f4 which is outside of the range $f1 - f3$ mentioned above and which is demodulated at the receiver and presented to the detector circuit of the invention as a constant d.c. voltage similar to the one illustratively shown in the right-hand portion of FIG. 2A.

In addition, it is desirable to have a preselected time delay associated with both the start and stop operations. Specifically, start up of the recorder may be designed to occur a preselected time after receipt of the start control signal and shut down occur approximately the same preselected time delay after receipt of the stop control signal. For this reason, the detector circuit of the invention comprises a circuit arrangement for enabling and disabling a facsimile receiver a preselected time after receipt of start and stop control signals, respectively, of the type shown in FIG. 2A. The detector circuit is also designed to be most sensitive to a start signal having the particular wave-shape shown in FIG. 2A.

U.S. Pat. No. 3,593,151, assigned to the assignee of the present invention, describes a detector for use in a facsimile receiver which monitors the FM input carrier signal and activates a print transducer motor when a 2200 Hz or greater carrier signal is detected. The motor, which rotates the transducer scanning drum, subsequently remains on as long as the carrier is at a frequency above 1400 Hz. The detector includes a transistor comparator which is biased initially to respond to a 2200 Hz carrier signal. When this carrier signal is received, the comparator generates an output signal which causes the printing transducer motor to be energized. Simultaneously, the bias applied to the input of the comparator is adjusted to a new value equal to the sum of the initial bais and a bias voltage obtained from the power supply energized by the initially received 2200 Hz carrier signal. The comparator is then biased so that a carrier signal of a frequency of 1400 Hz or greater will maintain the generation of the output signal.

OBJECTS & SUMMARY OF THE INVENTION

An object of the invention is to provide an improved carrier detect circuit of the type described in U.S. Pat. No. 3,593,151 for preventing false startups of printing transducers in facsimile transceivers.

A further object of the invention is to provide a carrier detect circuit with an improved noise rejection capability for preventing false startups due to spurious noise at the facsimile receiver.

These and other objects of the invention are accomplished by a detector circuit utilizing two comparators, the first of which initially switches output at a first bias level, and the second of which switches output responsive to a preselected voltage on a capacitor. The voltage on the capacitor is controlled by the output of the first comparator which charges and discharges it through a dual time constant arrangement in order to sensitize the detector to activate a recorder after a preselected delay only upon receipt of a particularly shaped long duty cycle input signal. After receipt of the input signal, the bias level of the first comparator is changed so as to prevent switching until receipt of a second preselected input signal. In addition, after receipt of the first input signal, the time constant of the charge-discharge arrangement for the capacitor is again altered.

BRIEF DESCRIPTION OF THE DRAWINGS

In the drawings,

FIGS. 2A to 2E are illustrations of signals appearing at various points in the circuit.

DETAILED DESCRIPTION OF THE INVENTION

Figure 1:
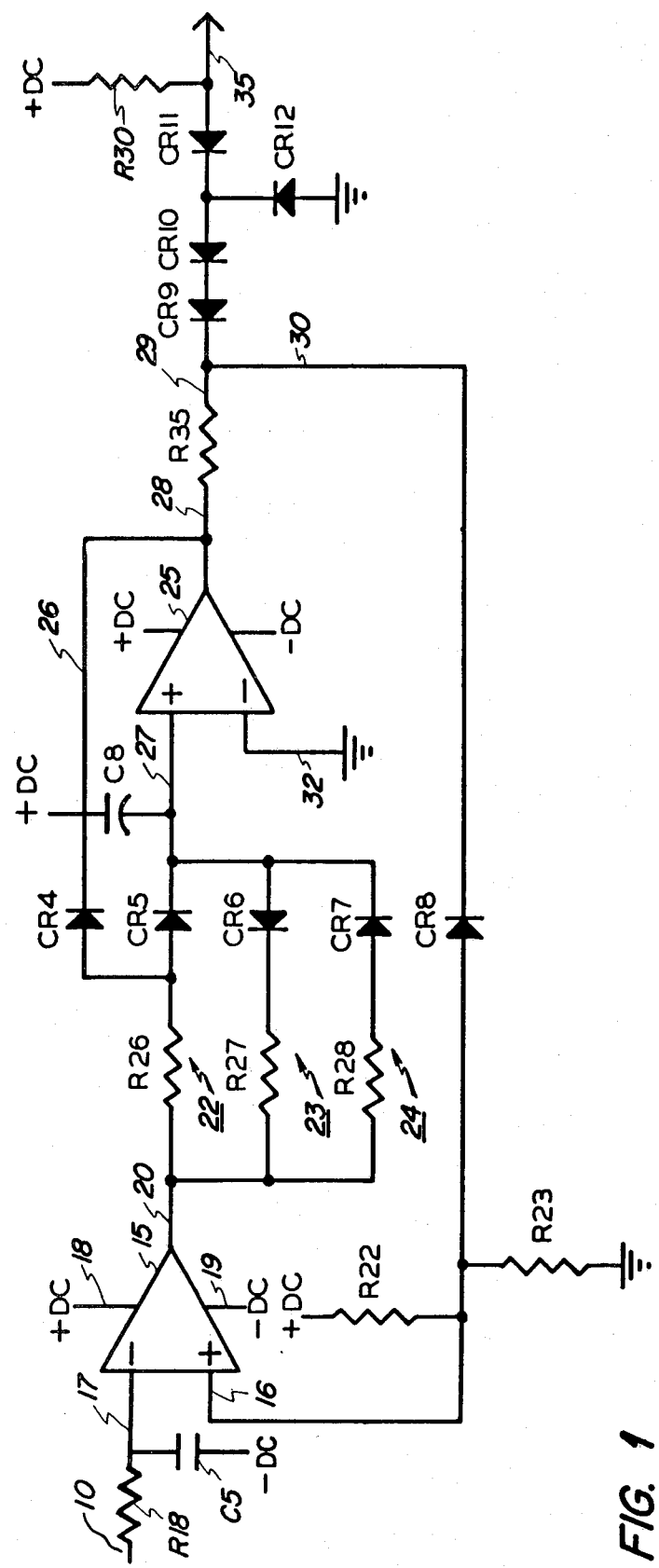
FIG. 1 is a schematic of the detector circuit of the invention.

Referring now to FIG. 1, there is shown a schematic drawing of the circuitry used in the carrier detect circuit of the present invention.

The input signals to the detector circuit which include the input signals shown in FIG. 2A are received on line 10 and passed through a low pass filter comprising resistor R18 and capacitor C5 which removes high frequency components therefrom. The signals passing through the low pass filter are connected via line 17 to the inverting input of a comparator circuit 15. The non-inverting input of the comparator circuit 15 is connected by the lead 16 to the junction of resistors R22 and R23 which comprise a portion of a biasing network for comparator 15. The other side of the resistor R22 is connected to a positive DC reference potential, while the other side of the resistor R23 is grounded. The above arrangement tends to bias the non-inverting input of the comparator 15 initially to a positive voltage, which we will refer to as V2, somewhere between ground and the positive DC potential connected R22, the exact value of this bias potential depending on the magnitude of the resistors R22 and R23. Comparator 15 operates in a conventional fashion to generate a positive output (approaching the +DC reference potential on line 18) when the potential on the non-inverting input terminal is more positive than the potential on the inverting terminal. In a similar fashion, a negative output (approaching the −DC potential on line 19) is generated on line 20 when the inverting input terminal is more positive than the non-inverting terminal.

The output of the comparator 15 generated on line 20 is connected via charging networks including three parallel paths 22, 23 and 24 and a conductor 27 to the non-inverting input of a second comparator 25. The first parallel path 22 is formed by the resistor R26 and the diode CR5. Additional parallel paths 23 and 24 are formed by the resistor R27 and diode CR6 and resistor R28 and diode CR7, respectively. It should be noted that the diode CR6 is poled in a direction opposite to the diodes CR5 and CR7, and the reason for this will be explained in greater detail hereinafter.

The inverting input of the comparator 25 is grounded via line 32. Comparator 25 operates similarly to comparator 15 previously described. Briefly, since the inverting input is grounded, the output potential on line 28 is highly positive (approaching the +DC potential) when the potential on line 27 is above ground, and switches to a negative potential (approaching −DC) when the voltage on line 27 falls below ground.

The output of the comparator 25 appearing on line 28, is connected to the cathode of diode CR4, the anode of diode CR4 being connected to the junction between the resistor R26 and the diode CR5. Line 28 is also connected via resistor R35 and leads 29 and 30 to the cathode of a diode CR8, the anode of diode CR8 being connected to the junction between the biasing resistors R22 and R23. The output of the comparator 25 on line 28 is also connected via resistor R35 and line 29 to ground via the similarly poled diodes CR9, CR10 and CR12. The junction between diodes CR10 and CR12 is connected to the cathode of diode CR11, the anode of which is connected to lead 35 which constitutes the output of the detector circuit. The output line 35 is returned through a resistor R30 to a source of positive potential.

In operation, when power is initially turned on for the detector circuit shown in FIG. 1, the inverting input of the comparator 15 is pulled to a highly negative voltage by the capacitor C5. In addition, the non-inverting input of the comparator 15 begins to move toward a positive potential V2 somewhere between ground and the positive DC supply connected to the top of resistor R22, depending on the values of the resistors R22 and R23. This potential V2 will become the first threshold switching potential at which the comparator 15 will change state. Under these conditions, since the non-inverting input, lead 16, of the comparator 15 is at a voltage which is more positive with respect to the voltage V2 on the inverting input, lead 17, the output of the comparator 15 on line 20 is positive (approaching +DC).

On power turn-on the non-inverting, input, line 27, of the comparator 25 is pulled positive by the capacitor C8, which is connected to a high positive DC reference potential. Since the inverting input of comparator 25 is connected to ground via line 32, the output of the comparator 25 on line 28 is highly positive. The highly positive output of compara-25 on line 28 back biases the diodes CR9, CR10, CR11 and CR12 with the result that the detector output on lead 35 is also pulled highly positive via the resistor R30 which is connected to the positive DC supply. The positive output of the comparator 25 on line 28 at power turn-on also reverse biases the diode CR4 and CR8, thereby equivalently preventing any effect on the circuit by these diodes.

It should be noted at this point that the output of the detector circuit on lead 35 is used to control the operation of recording device (not shown). With the voltage on line 35 highly positive the recording device is disabled, whereas when the voltage on line 35 approaches ground potential, the recording device is activated. Suitable circuits for accomplishing this control function are, of course, obvious to one skilled in the art.

Therefore, at power turn-on both the outputs of comparator 15 and comparator 25 are highly positive. The output on line 20 from comparator 15 serves to reenforce the positive bias applied to the non-inverting input of comparator 25 via the parallel paths 22 and 24.

The detector circuit will remain in the above-noted condition until the arrival of an input signal on line 17 which is more positive than the V2 bias level on the line 16.

Upon receipt of the start control signal, FIG. 2A, the voltage on line 17 rises for a relatively long time period to the level V3, several volts above the V2 threshold level and subsequently falls for a relatively short time period to the V1 level below the switching threshold. This start signal is repeated for a preselected time sufficient to actuate the recorder, as explained below.

During each excursion above V2, the comparator 15 switches state and its output on lead 20 switches negative, FIG. 2B. This back biases diode CR5 and CR7 and forward biases diode CR6 and which begins the flow of charging current to the capacitor C8 through the parallel path 23. As capacitor C8 charges, the potential on line 27 begins to drop from the previously positive value toward ground, FIG. 2C.

During the time periods when the start signal on line 17 drops below the V2 switching level, the output of comparator 15 on line 20 again goes positive, FIG. 2B. This back biases diode CR6 and forward biases diodes CR5 and CR7 terminating charging current to the capacitor C8 and begins a discharge of the capacitor through paths 22 and 24. As the capacitor C8 discharges, the voltage on line 27 again moves away from ground toward the positive DC level.

In order to improve the sensitivity of the detector circuit to the particular long duty cycle wave-shape of the start signal and to reduce the chance of the circuit being activated by noise signals on line 17, the charge time constant for C8 via path 23 is chosen to be much greater than the discharge time constant through the combined parallel paths 22 and 24. This dual time constant feature is clearly reflected in FIG. 2C which shows the potential at lead 27, one terminal of the capacitor C8. Specifically, when the output of comparator 15, FIG. 2B, is highly negative, capacitor C8 charges through long time constant charge path 23 and line 27, FIG. 2C, moves toward ground relatively slowly. When the output of comparator 15 switches momentarily positive, FIG. 2B, capacitor C8 discharges relatively rapidly through paths 22 and 24, and lead 27 moves rapidly toward the plus DC reference potential, FIG. 2C.

The result of the above-noted dual time constant charge-discharge arrangement is that any signal having a significantly shorter duty cycle than the start control signal, such as a random noise signal, is much less likely to charge C8 sufficiently to trigger comparator 25. For example, if a noise signal having a 50 percent duty cycle above and below the threshold V2 appears on line 17, the fast discharge time constant will prevent the voltage on line 27 from approaching ground. Due to the particular long duty cycle nature of the start control signal, the time during which discharge of C8 takes place through paths 22 and 24 is of such a short duration, that eventual charging of C8 to a sufficient voltage takes place after a preselected delay to actuate the comparator 25.

After receipt of several cycles of the start control signal the capacitor C8 will have charged sufficiently to pull the voltage on line 27 below ground in spite of the short time constant discharge paths 22 and 24, at which point the output from comparator 25 on line 28 will switch to a high negative potential. The voltage on line 27 will continue to be pulled negative even after comparator 25 has switched to a negative output and will approach the negative DC reference potential.

With the voltage on line 28 highly negative, the previously back biased diodes CR9, CR10, CR11 and CR12 are forwardly biased, thus pulling line 35 toward ground, FIG. 2D. As noted above, this actuates a recording device (not shown).

In addition, the negative potential on line 29 forwardly biases diode CR8 via line 30 and pulls line 16 at the non-inverting terminal of comparator 15 to a potential below ground. This effectively changes the threshold switching potential of the comparator 15 from the previous V2 to −V4, see FIG. 2E. In order for the comparator 15 now to be switched back to a positive output, the voltage on line 17 will have to drop below −V4 indicating the receipt of a stop control signal, FIG. 2A.

The negative output on line 28 is also coupled via lead 26 to the cathode of CR4, thus forwardly biasing this diode and back biasing diode CR5.

The above-noted conditions persist after the receipt of the start control signal and during the receipt of information signals, but prior to the receipt of the stop control signal, FIG. 2A. Upon receipt of the stop control signal, the output of comparator 15 switches positive again. This forwardly biases CR7 and C8 begins to discharge through path 24. CR5 is held back biased by the negative voltage applied to its anode via CR4. It can be appreciated that the discharge time constant for C8 has been altered from the previous value utilized during receipt of the start signal by rendering path 22 inoperative by back biasing diode CR5.

As C8 discharges via path 24 the voltage on line 27 again approaches the positive DC reference potential and when it passes through ground level comparator 25 switches its output positive. This returns the circuit to its quiescent condition by back biasing diodes CR9, CR10, CR11 and CR12. Thus, the output potential on line 35 goes positive turning off the recording device or printer (not shown). Diode CR8 is again back biased, thereby returning the threshold switching level on the non-inverting input of comparator 15 from −V4 to V2, FIG. 2E. CR4 is again back biased to return the change control paths to the dual time constant arrangement in which paths 22, 23 and 24 will become operative upon receipt of a start control signal.

The above explained cycles repeats itself upon subsequent receipt of successive start and stop control signals.

Representative values of circuit components schematically illustrated in FIG. 1 are listed hereinbelow:

Comparators 15 and 25 — 741 IC op. amp.
R18 — 10K
R22 — 6.9K
R23 — 14.7K
R26 — 100K
R27 — 365K
R28 — 523K
R30 — 27K
R35 — 2.7K
C8 — 2.2 MFD, 35V
C5 — 1 MFD, 35V
Diodes — IN3063
+DC, +14V
+DC, −14V Using the above-noted components in a circuit with a 0v to 8.1 V voltage swing on line 17 for received information and start control signals, and a negative 2V potential for the stop control signal a time delay of 800 milliseconds between receipt of control signals and actual adjustment of the recorder is produced.

Summarizing the operation of the circuit it is seen that the long duty cycles start control signal is made to control the charging of a capacitor at a first rate and the discharging of a capacitor at a second rate via a dual time constant charge control arrangement. After receipt, this time constant arrangement is altered to discharge the capacitor in response to a single level stop control signal at a rate different from the rate previously employed to discharge the capacitor during receipt of the start control signal.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to a teaching of the invention without departing from its essential teachings.

What is claimed is:

1. A detector circuit for providing an output signal a predetermined time after receipt of an input signal having an initial predetermined characteristic and for thereafter maintaining said output signal while said input signal remains within a predetermined range, said predetermined characteristic comprising repetitive periods of a first level component above a threshold level within said range and a second level component of relatively short duration outside said range; said detector circuit comprising switching means for generating a first signal in response to said input signal being above said threshold level and a second signal in response to said input signal being below said threshold level, a capacitor, means responsive to a preselected voltage level on said capacitor for providing said output signal, and charge control means responsive to said first signal to charge said capacitor at a first rate and responsive to said second signal to discharge said capacitor at a second rate, said first and second rates being selected to cause the voltage on said capacitor to reach said preselected voltage level whenever said input signal has said predetermined characteristic for said predetermined time.

2. The detector circuit of claim 1 wherein said input signal includes information signals and control signals, said information signals varying in said range bounded by a first potential and a second potential, and said switching means comprises comparator means having a pair of input terminals and an output terminal, one of said input terminals coupled to receive said input signal, first bias means for initially biasing the other input terminal of said comparator means to said threshold level, and second bias means responsive to said output signal for biasing said other input terminal to a third potential outside said range.

* * * * *

UNITED STATES PATENT AND TRADEMARK OFFICE
CERTIFICATE OF CORRECTION

PATENT NO. : 3,990,048
DATED : November 2, 1976
INVENTOR(S) : Bruce R. Kanitz and Charles L. Jacobson It is certified that error appears in the above-identified patent and that said Letters Patent are hereby corrected as shown below:

Column 1, line 11, "functions" should read --function--.

Column 2, line 27, "bais" should read --bias--.

Column 3, line 23, insert --to-- after "connected".

Column 4, line 17, delete "," (first occurrence).

Column 4, line 23, "compara-25" should read --comparator 25--.

Column 4, line 33, insert --a-- after "of".

Column 6, line 18, "change" should read --charge--.

Column 6, line 22, "cycles" should read --cycle--.

Column 6, line 29 should read --R22 - 16.9K--.

Column 6, line 40 should read -- -DC, -14V --

Column 6, line 42, "Ov" should read --OV--.

Signed and Sealed this

Twelfth Day of April 1977

[SEAL]

Attest:

RUTH C. MASON
Attesting Officer

C. MARSHALL DANN
Commissioner of Patents and Trademarks